United States Patent
Bekkering et al.

[11] Patent Number: 5,091,329
[45] Date of Patent: Feb. 25, 1992

[54] METHOD FOR PROGRAMMING MOS AND CMOS ROM MEMORIES

[75] Inventors: Roland Q. Bekkering, Varese; Manlio S. Cereda, Lomagna, both of Italy

[73] Assignee: SGS-Thomson Microelectronics S.r.l., Agrate Brianza, Italy

[21] Appl. No.: 322,132

[22] Filed: Mar. 13, 1989

[30] Foreign Application Priority Data

Mar. 28, 1988 [IT] Italy ............... 19989 A/88

[51] Int. Cl.⁵ .................................. H01L 21/70
[52] U.S. Cl. ........................ 437/52; 437/40; 437/48; 437/56; 437/57
[58] Field of Search ............... 437/40, 41, 45, 48, 437/49, 51, 52, 56, 57; 351/23.12, 45; 364/174, 187

[56] References Cited

U.S. PATENT DOCUMENTS

| | | | |
|---|---|---|---|
| 4,268,321 | 8/1981 | Meguro | 437/56 |
| 4,359,817 | 11/1982 | Dickman et al. | 437/52 |
| 4,406,049 | 9/1983 | Tam et al. | 437/47 |
| 4,536,944 | 8/1985 | Bracco et al. | 437/983 |
| 4,536,947 | 8/1985 | Bohr et al. | 437/57 |
| 4,598,460 | 8/1986 | Owens et al. | 437/52 |
| 4,608,748 | 9/1986 | Noguchi et al. | 437/52 |
| 4,642,877 | 2/1987 | Garnetl et al. | 437/56 |
| 4,683,641 | 8/1987 | Ravindhran et al. | 437/41 |
| 4,826,779 | 5/1989 | Wright et al. | 437/52 |

OTHER PUBLICATIONS

Verhelst, "Source/Drain Personalization for Read-Only Storage Array", IBM TDB, vol. 24, No. 10, Mar. 1982, p. 5064.

*Primary Examiner*—Brian E. Hearn
*Assistant Examiner*—Tom Thomas
*Attorney, Agent, or Firm*—Guido Modiano; Albert Josif

[57] ABSTRACT

A method for programming ROM memories at an advanced memory manufacture stage. The method, after defining the active regions, possibly implanting threshold-correction boron, performing gate oxidation and providing the gate regions, comprises at least partially masking the regions adjacent to the gate regions of the memory cells which must be made permanently non-conductive. During the subsequent implanting of the source and drain regions, the regions thus shielded are not implanted, so that in the programmed cells at least one region of the source and drain regions is completely missing so as to prevent switching on of the memory cell when reading in the memory.

7 Claims, 1 Drawing Sheet

METHOD FOR PROGRAMMING MOS AND CMOS ROM MEMORIES

BACKGROUND OF THE INVENTION

The present invention relates to a method for programming MOS and CMOS ROM memories. In particular, programming is performed by making permanently non-conductive or switched off all the cells to be tied to a preset logic state.

As is known, ROM (Read Only Memory) cells are extensively used to store permanent data and are manufactured individually or integrated with microprocessors and microcontrollers in MOS or CMOS technology. Since read-only memories must be "customized" (i.e. programmed according to the required application), the need is felt to program said memories at an advanced stage of production so as to reduce the delivery times of the devices programmed with the content requested by the user. It is furthermore known that ROM memories are generally constituted by arrays of cells formed by N-channel or P-channel transistors often having a CMOS read circuitry.

Various methods are currently used to program ROM memories. In particular, one of said methods uses the active-area mask as a programming mask. However, this method allows programming at an initial stage of the production of the devices, so that other programming methods, performed at later stages, are generally preferred. Thus, according to another solution (in the case of memory cells manufactured using N-channel transistors, which are preferred in view of the higher mobility of the electrons), boron is implanted at such a dose as to raise the threshold voltage of the transistors of the array, which are selected by means of an appropriate programming mask, above the supply voltage. This solution cannot be applied, in any case, to VLSI devices with thin gate oxides (less than 350Å) since boron implanting would lower the breakdown voltage to unacceptable values.

Other solutions have therefore been proposed which allow to raise the threshold of the programming cell above the supply voltage while keeping the breakdown voltage of the source and drain junctions above the supply voltage. According to a known solution, boron is implanted at a lower dose so as to not lower the breakdown voltage of the junctions below the supply voltage while raising the threshold voltage almost sufficiently. In particular, this method comprises a programming masking, etching of the oxide, grown after the source/drain implanting, covering the cells to be programmed, and subsequent boron implanting. A re-oxidation step is then performed, producing a reduced growth of oxide on the un-programmed transistors still covered with oxide, while on the programmed uncovered cells the re-oxidation reduces and narrows the polysilicon gate regions and raises the edges of the polysilicon gate regions due to the growth of oxide below said edges, thus separating the source and drain junctions from the gate and further raising the threshold of the programmed cell, raising it above the supply voltage. However this solution, too, is not free from disadvantages, since the re-oxidation step occurs at low temperature (800° C.) for a relatively long time so as to avoid threshold shifts and other doping-agent diffusion effects and entails a deviation from the standard manufacturing processes currently in use.

Still another solution is to implant the boron in the source region and subsequently diffuse it below the gate. In this manner the threshold voltage can be raised above the supply voltage without lowering the breakdown voltage, since the latter is affected only by the channel concentration proximate to the drain. However this process, too, is not always satisfactory, and in particular it cannot be applied to VLSI devices with common-source cell arrays.

SUMMARY OF THE INVENTION

Given this situation, the aim of the present invention is to provide a method for programming MOS memories which eliminates the disadvantages of known solutions.

In particular, an object of the present invention is to provide a method which can be executed at an advanced stage of manufacture.

A particular object of the present invention is to provide a programming method which can be used in modern families of VLSI devices with thin gate oxides.

Still another object of the present invention is to provide a manufacturing method which can also be used for common-source memory structures.

Not least object of the present invention is to provide a programming method which does not require additional process steps with respect to known methods and can be executed with the conventional devices in use in the electronics industry, therefore allowing to program memories with costs comparable with those of known solutions.

This aim, the mentioned objects and others which will become apparent hereinafter are achieved by a method for programming MOS and CMOS ROM memories as defined in the accompanying claims.

In particular, according to the invention the memory cells are programmed by masking the cells which must be made permanently non-conductive or switched off so that during the subsequent implanting for providing the source and gate regions of the transistors said programmed cells have no source and/or drain regions, or at least have source and/or drain regions which are separated from the gate regions so as to prevent said cells from conducting upon biasing of the gate.

BRIEF DESCRIPTION OF THE DRAWINGS

Further characteristics and advantages of the invention will become apparent from the description of preferred but not exclusive embodiments explained hereinafter with the aid of the accompanying drawings, wherein.

DESCRIPTION OF THE PREFERRED EMBODIMENTS

Figure 1:
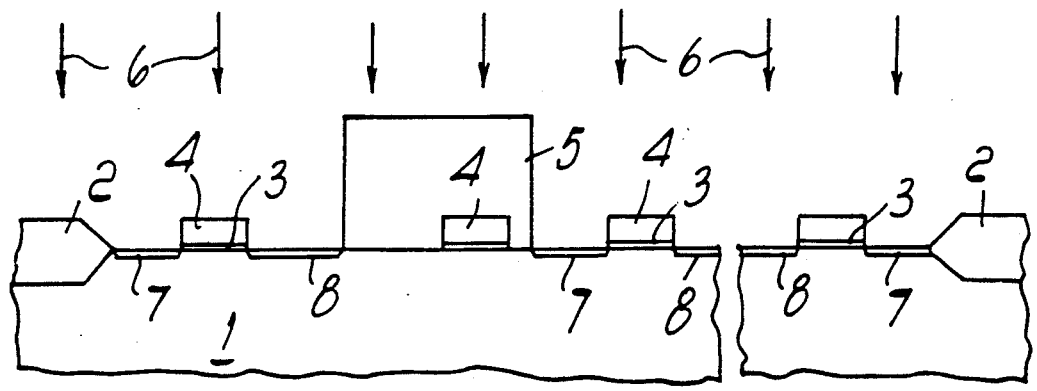
FIGS. 1 to 3 are transverse sectional views taken across a silicon wafer which integrates a ROM memory with common-source structure during three manufacture steps.
Figure 4:
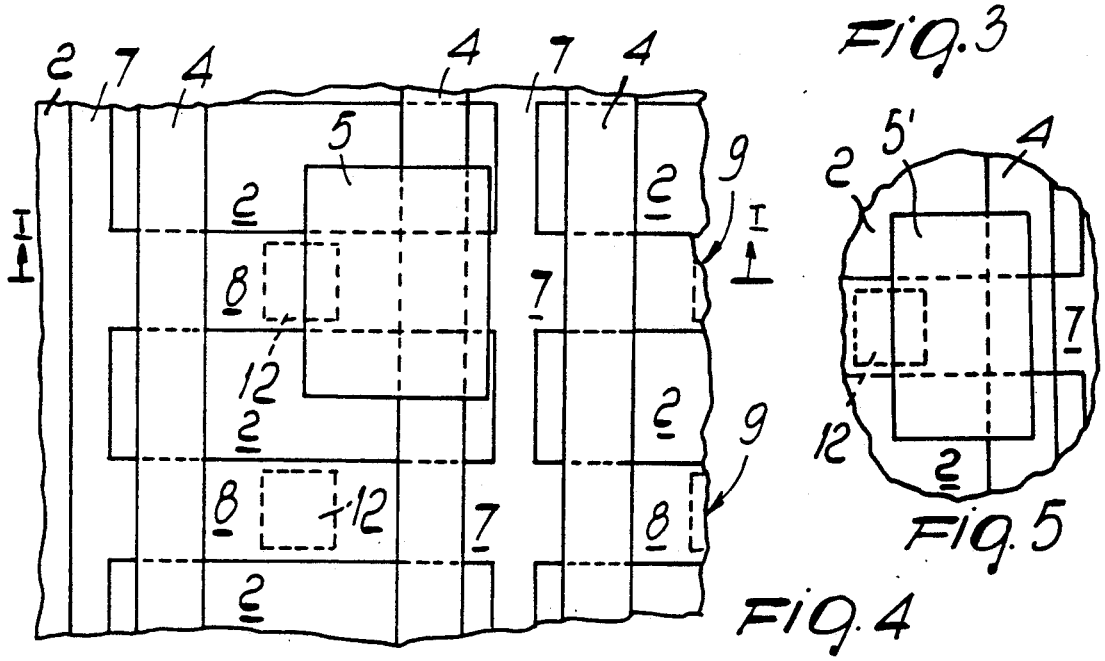
FIG. 4 is a plan view of said device during the programming step illustrated in FIG. 1.

In detail, the figures illustrate some steps for the production of a memory array constituted by N-channel cells with a common-source structure. FIG. 1 illustrates an already intermediate structure obtained by means of standard steps comprising the definition or delimitation of the active regions on a P-type substrate 1 by growing field-oxide regions 2 which delimit said active regions. Said active regions are then subject, in a known manner, to a gate oxidation and to the subsequent deposition of a polysilicon layer which is then masked to shape the gate regions. The structure thus obtained has, besides the substrate 1 and the field oxide regions 2, the gate oxide layer 3 and the gate regions 4, and can be stored until requested by a final user indicating the required programming. At this point, according to the invention, the structure is subject to a gate-oxide etching to remove the portions of said layer which cover the active regions to the side of the gate regions 4. According to the invention, a masking step then follows to cover at least partially the memory cells which must be made permanently non-conductive. In particular, the resist regions 5 are superimposed at least partially on the gate regions and on the source and/or drain regions of the cells to be programmed. In the illustrated example, the resist mask 5 completely covers the gate region and the region of the substrate in which the drain of the memory cell should be produced, and only partially covers the substrate region corresponding to the source region, relatively to the second memory cell from the left of a row of the array, as illustrated in particular in FIG. 4. The other memory cells (i.e. the cells to the left and to the right of the programmed cell, as well as the rightmost cell of the row), which must not be programmed, are instead not covered by the resist. An arsenic source/drain implanting is then performed on this structure, as indicated by the arrows 6. According to a particular embodiment, this implanting can be performed with an arsenic dosage of $5.2 \times 10^{15}$ at 80 KeV. Arsenic ions thus accumulate inside the thin layers 7 and 8 which respectively constitute the source and drain regions of the cells of the memory array. The planar structure of this region is more clearly illustrated in FIG. 4, which shows the horizontal bands 9 of the active regions (which accommodate the more heavily doped N+-type regions 7 and 8), the vertical gate-polysilicon bands 4 and the vertical common source bands 7.

Figure 2:
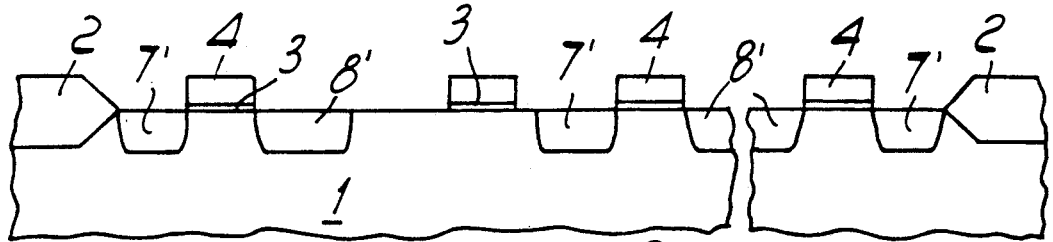

Then, after removing the resist mask, an annealing step is performed at 550° C. to recover the crystallographic damage due to the implanting and to make electrically active the atoms of the source and drain regions respectively indicated by 7' and 8' in FIG. 2. As can be seen, the gate region of the second cell from the left is separated from the drain region 8', which it would otherwise have in common with the adjacent leftward region, and from the common-source region 7' which is shared with the adjacent rightward cell and with the cells located above and below in the same column in the layout of FIG. 4.

Figure 3:
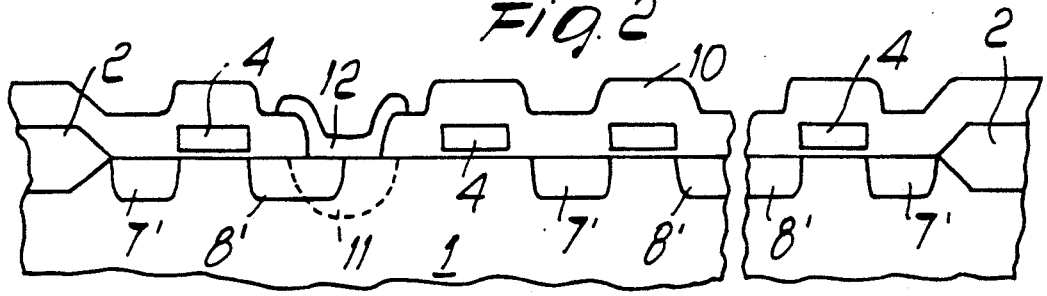

The method continues conventionally by re-oxidating the source and drain regions, depositing the covering dielectric (indicated at 10 in FIG. 3), opening the contacts, providing the metalizations (the one provided at the drain contact 12 being shown in FIG. 3) and by subsequently performing passivation. FIG. 3 also illustrates the region 11 at the drain contact, which is doped with phosphorus originating from a pre-deposition performed after opening the contacts in the dielectric.

If the ROM array is made simultaneously with CMOS devices of the read circuitry or to the microprocessor or microcontroller integrated in the wafer, the programming masking can be performed simultaneously with the masking for implanting the source and drain regions of the transistors having the same channel type as the memory cells, typically the N-channel type.

In particular, assuming there are N-channel, P-channel and drain-extension N-channel transistors in the logical part produced with CMOS technology, the production method comprises the conventional initial steps for defining the active regions, possibly implanting boron to adjust the threshold voltage, growing the gate-oxide layer, forming the gate regions of all the transistors including the memory cells and hence etching the gate-oxide regions in the active regions laterally to said gate regions. Then a specific protection mask is deposited, covering the entire memory cell array to allow implanting of drain-extension phosphorus on the logical part of the circuit. After removing the protection mask, the mask for delimiting the source and drain regions, for example of the N type, is deposited. Said mask covers all the P-channel transistors, part of the drain regions of the N-channel transistors with drain-extension in the logical part and part of the cells in the ROM array to be programmed, to prevent the source and/or drain regions of the cells which must be set permanently off to be implanted. This step corresponds (as regards the part of the circuit comprising the ROM memory) to the step illustrated in figure 1 and already explained earlier. Subsequently, after removing the mask of the N-channel transistors, a second mask is deposited to allow implanting of the source and drain regions of the P-channel transistors of the logical part. Said mask covers all the N-channel transistors in the logical portion and completely covers the array of memory cells (which are also of the N-channel type, as mentioned). After implanting boron to provide the source and drain regions with P-type conductivity, the process continues in a known manner, with the annealing which activates the atoms implanted in the source and drain regions, an oxidation, the deposition of the dielectric, the execution of the contacts, etc.

If the employed process entails no drain-extension transistors, the protection masking step and the subsequent phosphorus implanting are naturally eliminated, thus avoiding the addition of processing steps to the standard method.

Figure 5:
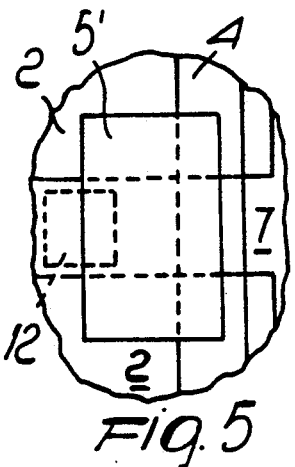
FIG. 5 shows detail of the structure of FIG. 4, in a different embodiment.

In practice, as is apparent from the above description, according to the invention the memory cells which must be programmed so as to be permanently non-conductive are shielded during the source and drain implanting step to prevent the related source and/or drain region to form, or at least, when size or process reasons prevent this elimination, to provide a non-doped region to the side of the channel region extending below the gate, i.e. to widen the channel region beyond the gate region so as to prevent switching-on of the transistor constituting the memory cell when the related gate is biased. According to the invention, the mask must at least partially cover the substrate portion in which the source region should be provided or, as in the illustrated example, the substrate region in which the drain region should be provided. If size relationships allow to do so, the optimum situation is to cover both regions to the side of the gate, eliminating or at least separating the source and drain regions from their own gate region. If however the dimensions of the device are critical to the point that they do not ensure safety conditions in the production of the memory array (for example in the production of common-source memory arrays of the type illustrated in FIG. 4, where however the source band 7 is very narrow, so that a misalignment of the programming mask may completely cover the common-source band, causing a production error), the protection mask may be designed, on the critical side, so as to cover only part of the gate region of the cell to be programmed. Specifically, in the previously mentioned case of a very reduced source band, the programming mask preferably covers only the part of the gate directed towards the drain region (i.e. the leftward portion of the programmed cell) and said drain region, as shown in the detail illustrated in FIG. 5, where the programming mask has been indicated by 5'.

As can be seen from the above description, the invention fully achieves the intended aim and objects. In fact, according to the invention, a programming method is provided which can be performed in a rather advanced step of the production process, since it is executed after forming the gate regions of the transistors. Though the method according to the invention entails programming in an apparently earlier step with respect to the known solution which implanted boron after forming the source and drain regions of all the memory cells, programming times are actually shorter than, or in any case comparable with, those of said known method, since the long oxidation step is eliminated.

The described method is furthermore particularly suitable for processes involving low-resistivity polysilicon layer, since it eliminates the second oxidation which reduces the thickness of the polycrystalline silicon layer, increasing its resistivity.

This method can furthermore be also applied to VLSI processes with thin gate oxide (under 350Å), does not reduce the breakdown voltage of the junctions and is very reliable.

The invention thus conceived is susceptible to numerous modifications and variations, all of which are within the scope of the inventive concept. In particular, if the distance between the drain contact and the gate and between the latter and the source region is very small, so that the gate and source junction cannot be adequately separated, a boron implanting can be introduced immediately ahead of the programming masking. This boron implanting, which can be added to the threshold-adjustment boron implanting performed before gate oxidation, allows to form a heavily doped region with P-type conductivity laterally to the gate so as to prevent switching on of the channel.

All the details may furthermore be replaced with other technically equivalent ones.

We claim:

1. A method for programming VLSI MOS and CMOS ROM memories comprising a plurality of memory cells each having source and drain regions separated by a channel region and a gate region superimposed on said channel region, with the memory cells having a substantially common structure and being arranged in rows of cells each having its source region in common with the cell arranged on a side thereof and its drain region in common with the cell arranged on an opposite side thereof, the method comprising the steps of forming the gate regions on a substrate of semiconductor material having a first conductivity type, at least partially shielding substrate regions adjacent to the channel regions of the memory cells to be programmed to an always-off state and introducing doping ion species in said substrate for forming said source and drain regions having a second conductivity type, substantially opposite to said first conductivity type thereby obtaining non-doped substrate regions adjacent to the gate regions, wherein before introducing said doping ion species the memory cells to be programmed to the always-off state are covered with a mask which extends at least partially on the gate region and substantially on one side thereof after introduction of ion species the gate regions of programmed cells are spaced from adjacent common source regions.

2. A method according to claim 1, wherein further ion species for imparting send first conductivity type are introduced before the memory cells are covered with the mask.

3. A method for programming VLSI MOS and CMOS ROM memories comprising a plurality of memory cells each having source and drain regions separated by a channel region and a gate region superimposed on said channel region, with the memory cells having a substantially common structure and being arranged in rows of cells each having its source region in common with the cell arranged on a side thereof and its drain region in common with the cell arranged on an opposite side thereof, the method comprising the steps of forming the gate regions on a substrate of semiconductor material having a first conductivity type, at least partially shielding substrate regions adjacent to the channel regions of the memory cells to be programmed to an always-off state and introducing doping ion species in said substrate for forming said source and drain regions having a second conductivity type, substantially opposite to said first conductivity type thereby obtaining non-doped substrate regions adjacent to the gate regions, wherein before introducing said doping ion species the memory cells to be programmed to the always-off state are covered with a mask which extends at least partially on the gate region and substantially on one side thereof thereby after introduction of ion species the gate regions of programmed cells are spaced from adjacent common drain regions.

4. A method according to claim 3, wherein further ion species for imparting said first conductivity type are introduced before the memory cells are covered with the mask.

5. A method according to claim 1, 2 or 3, wherein said first conductivity type is the P type and said second conductivity type is the N type.

6. A method according to claims 1 or 3, with said memory cells being made simultaneously with CMOS devices comprising first MOS transistors with channels having said first conductivity type and second transistors with channels having said second conductivity type, said method comprising after said gate region forming step, a first substrate masking step for covering substrate regions intended for accommodating the first MOS transistors and the memory cells to be programmed to an always-off state, a first doping ion species introduction step for selectively imparting the second conductivity type in the substrate to form drain and source regions of the second transistors and of memory cells not be programmed to the always-off state, a second masking step for covering substrate regions accommodating the second transistors and the memory cells, and a second doping ion species introduction step for selectively imparting the first conductivity type in the substrate to form the source and drain regions of the first transistors.

7. A method according to claim 6, with the second transistors having drain-extension regions, comprising, before said first masking step, a third masking step for covering substrate regions intended for accommodating the memory cells and the first transistors and a third doping ion species introduction step for imparting said second conductivity type to form the drain-extension regions.

* * * * *